US010691358B2

(12) United States Patent
Lin

(10) Patent No.: US 10,691,358 B2
(45) Date of Patent: Jun. 23, 2020

(54) MEMORY CONTROLLER AND METHOD CAPABLE OF USING DIFFERENT STORING MODES TO STORE DATA UNITS HAVING DIFFERENT DATA SIZES

(71) Applicant: Silicon Motion Inc., Hsinchu County (TW)

(72) Inventor: Ming-Yen Lin, Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 85 days.

(21) Appl. No.: 16/008,047

(22) Filed: Jun. 14, 2018

(65) Prior Publication Data

US 2019/0384517 A1    Dec. 19, 2019

(51) Int. Cl.
G06F 12/00 (2006.01)
G06F 3/06 (2006.01)
G06F 12/02 (2006.01)
G11C 11/56 (2006.01)

(52) U.S. Cl.
CPC ............ G06F 3/0634 (2013.01); G06F 3/061 (2013.01); G06F 3/0658 (2013.01); G06F 3/0673 (2013.01); G06F 12/0246 (2013.01); G11C 11/5628 (2013.01); *G11C 2211/5641* (2013.01)

(58) Field of Classification Search
None
See application file for complete search history.

(56) References Cited

U.S. PATENT DOCUMENTS

| 9,530,491 | B1* | 12/2016 | Uttarwar | G11C 11/5628 |
| 2009/0175075 | A1* | 7/2009 | Yeh | G06F 12/0246 |
| | | | | 365/185.03 |
| 2011/0044102 | A1* | 2/2011 | Dong | G11C 11/5628 |
| | | | | 365/185.03 |
| 2012/0155167 | A1* | 6/2012 | Uehara | G11C 11/5628 |
| | | | | 365/185.03 |
| 2017/0038969 | A1* | 2/2017 | Choi | G06F 3/061 |
| 2019/0095116 | A1* | 3/2019 | Igahara | G06F 3/0659 |

FOREIGN PATENT DOCUMENTS

TW    200931412    7/2009

\* cited by examiner

*Primary Examiner* — John A Lane
(74) *Attorney, Agent, or Firm* — Winston Hsu

(57) ABSTRACT

A method applied into a memory controller coupled between a memory device and a host device wherein the memory device supports at least two different storing modes includes: receiving and buffering data transmitted from the host device; using a first storing mode to store a first data unit into the memory device, a size of the first data unit being not larger than a size of a specific storage unit defined in the memory device; and using a second storing mode, different from the first storing mode, to store a second data unit into the memory device, a size of the second data unit being larger than the size of the specific storage unit.

13 Claims, 4 Drawing Sheets

MEMORY CONTROLLER AND METHOD CAPABLE OF USING DIFFERENT STORING MODES TO STORE DATA UNITS HAVING DIFFERENT DATA SIZES

BACKGROUND OF THE INVENTION

1. Field of the Invention

The invention relates to a memory controller storing mechanism, and more particularly to a memory controller and corresponding method capable of dynamically using different storing modes to store different sizes of data into a memory device.

2. Description of the Prior Art

Generally speaking, when a conventional memory controller writes or stores data units into a flash memory which supports an MLC (multi-level-cell) storing mode, the conventional memory controller needs to read back portion data from the flash memory and then uses the portion data with the data unit to be stored to form/generate even storage page data and odd storage page data, and then store the even storage page data and odd storage page data into an even storage page and an odd storage page of the flash memory for one storing operation. This portion data may comprise tail data and/or header data, and the operation of using the portion data with the data unit to form the page data can be regarded as a data complement process. That is, for a single one storing operation, the conventional memory controller is arranged to store a data amount of two storage pages into even and odd storage pages of the flash memory even though the size of data unit transmitted from host device and to be stored is smaller than that of one storage page. The performance of storing data is thus degraded.

SUMMARY OF THE INVENTION

Therefore one of the objectives of the invention is to provide a memory controller and method to solve the above-mentioned problems.

According to embodiments of the invention, a memory controller coupled between a memory device and a host device is disclosed. The memory device supports at least two different storing modes. The memory controller comprises a buffer circuit and a processing circuit. The buffer circuit is configured for receiving and buffering data transmitted from the host device. The processing circuit is coupled to the buffer circuit and is configured for: using a first storing mode to store a first data unit into the memory device, a size of the first data unit being not larger than a size of a specific storage unit defined in the memory device; and using a second storing mode, different from the first storing mode, to store a second data unit into the memory device, a size of the second data unit being larger than the size of the specific storage unit.

According to the embodiments, a memory controller coupled between a memory device and a host device is further disclosed. The memory device supports at least two different storing modes. The memory controller comprises a buffer circuit and a processing circuit. The buffer circuit is configured for receiving and buffering a data unit transmitted from the host device and to be stored into the memory device. The processing circuit is coupled to the buffer circuit and configured for using an SLC storing mode to store the data unit, transmitted from the host device, into the memory device for one time, a size of the data unit being not larger than a size of a storage page unit of the memory device.

According to the embodiments, a memory controller coupled between a memory device and a host device is disclosed. The memory device supports at least three different storing modes. The memory controller comprises a buffer circuit and a processing circuit. The buffer circuit is configured for receiving and buffering a data unit transmitted from the host device and to be stored into the memory device. The processing circuit is coupled to the buffer circuit and is configured for using an MLC storing mode to store the data unit, transmitted from the host device, into the memory device for one time, a size of the data unit being not larger than a size of two storage page units of the memory device.

According to the embodiments, a method applied into a memory controller coupled between a memory device and a host device is disclosed. The memory device supports at least two different storing modes. The method comprises: receiving and buffering data transmitted from the host device; using a first storing mode to store a first data unit into the memory device, a size of the first data unit being not larger than a size of a specific storage unit defined in the memory device; and using a second storing mode, different from the first storing mode, to store a second data unit into the memory device, a size of the second data unit being larger than the size of the specific storage unit.

According to the embodiments, the performance of storing data into the memory device can be improved significantly as well as the circuit costs can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
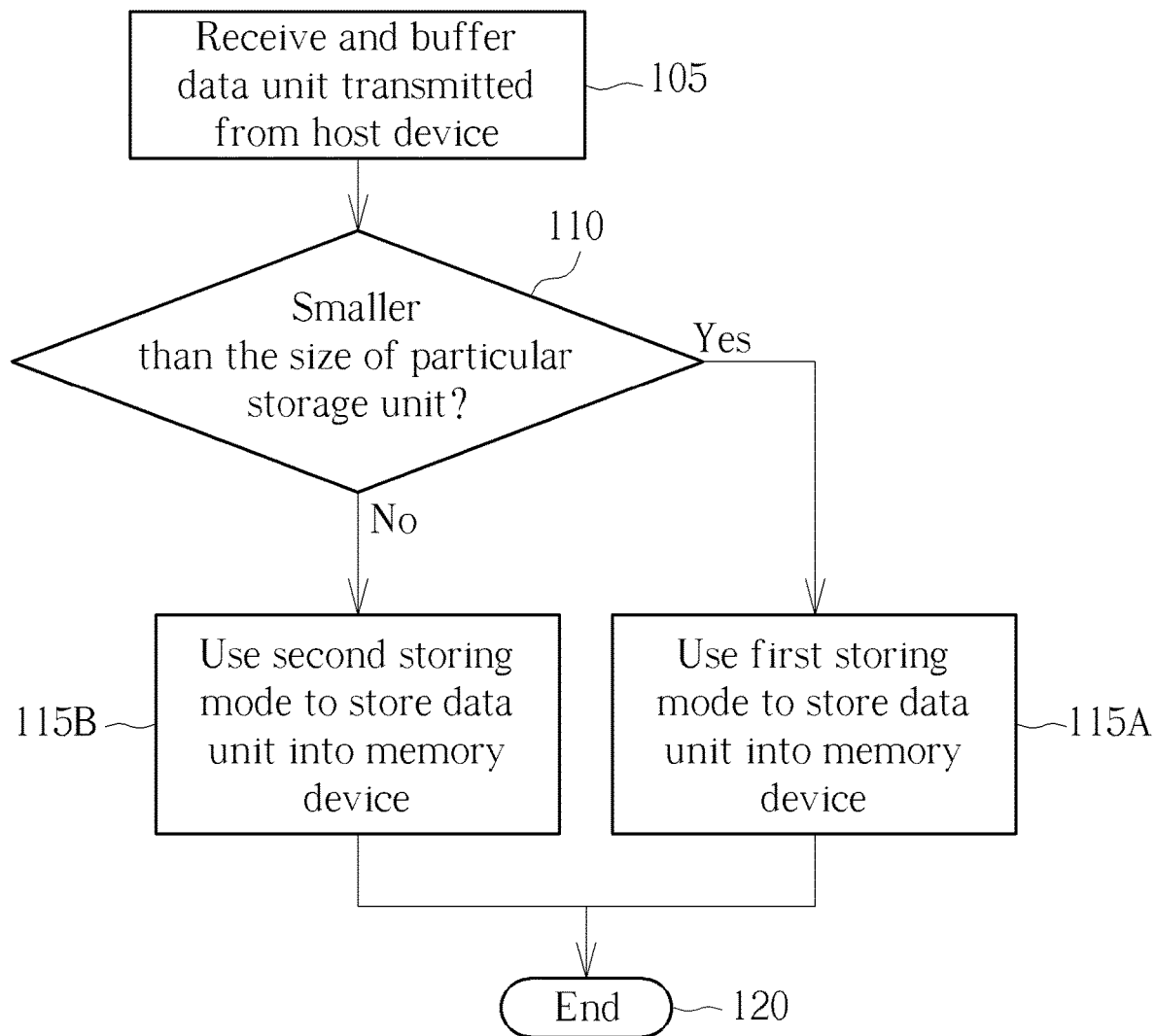
FIG. 1 is a flowchart diagram of a method applied into a memory controller (e.g. a flash memory controller) to dynamically switch from a storing mode into a different storing mode to use different storing modes to store different sizes of data into a memory device such as a flash memory device respectively according to embodiments of the invention.
Figure 2:
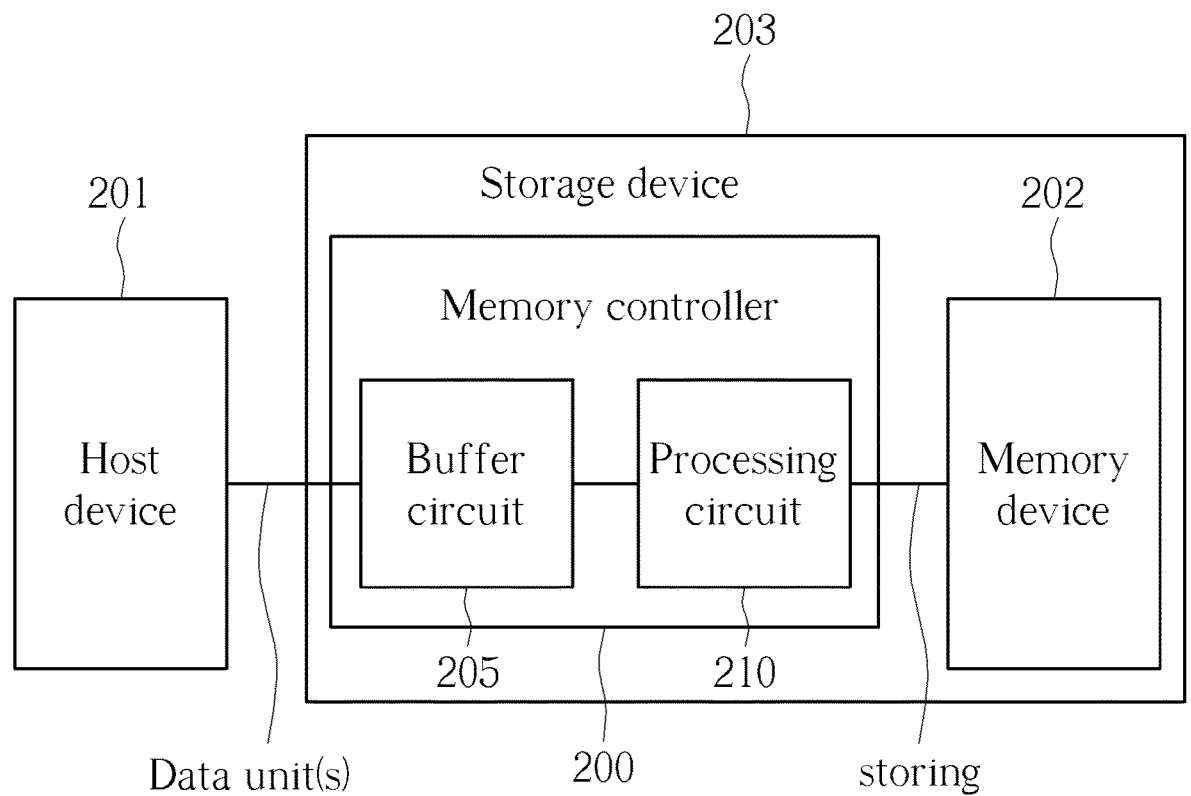
FIG. 2 is a block diagram of a memory controller according to one embodiment of FIG. 1.

Refer to FIG. 1 in conjunction with FIG. 2. FIG. 1 is a flowchart diagram of a method applied into a memory controller (e.g. a flash memory controller) to dynamically switch from a storing mode into a different storing mode to use different storing modes to store different sizes of data into a memory device such as a flash memory device respectively according to embodiments of the invention. FIG. 2 is a block diagram of a memory controller 200 according to one embodiment of FIG. 1. The memory controller 200 for example is a part of a storage device 203

(e.g. solid state drive/disk (SSD)) which also comprises the memory device 202 such as 3D flash memory, and is coupled between the host device/terminal 201 and the memory device 202, and comprises a buffer circuit 205 and a processing circuit 210.

Provided that substantially the same result is achieved, the steps of the flowchart shown in FIG. 1 need not be in the exact order shown and need not be contiguous, that is, other steps can be intermediate. Steps are detailed in the following:

Step 105: Use the buffer circuit 205 to receive and buffer a data unit transmitted from the host device 201;

Step 110: Use the processing circuit 210 to determine whether a size of the data unit is not larger than a size of a particular/specific storage unit defined in the memory device 202; if the size of the data unit is not larger than the size of the particular/specific storage unit, the flow proceeds to Step 115A, otherwise, the flow proceeds to Step 115B;

Step 115A: Use a first storing mode to store the data unit into the memory device 202;

Step 115B: Use a second storing mode, different from the first storing mode, to store the data unit into the memory device 202; and Step 120: End.

As shown in FIG. 2, the buffer circuit 205 is arranged to receive and buffer data transmitted from the host device 201 (Step 105). For example, the host device 201 may be a camera device or a driving recorder (but not limited), and may sequentially write/record different data having identical or almost identical data size such as 4 KB data (but not limited) into the memory device 202 of the storage device 203. Each time when the host device 201 transmits a data unit to the memory controller 200, the memory controller 200 is use the buffer circuit 205 to receive and buffer such data unit and initiates one data storing operation for one time to write or store the data unit into the flash memory 202.

The memory device 202 is for example a 3D flash memory device and is capable of supporting at least two different storing modes such as SLC (single-level-cell) storing/programming mode and MLC (multi-level-cell) storing/programming mode. In other embodiments, the memory device 202 may further support TLC (triple-level-cell) storing/programming mode and/or QLC (quad-level-cell) storing/programming mode. In the SLC storing mode, the memory controller 200 is arranged to execute the data storing operation for one time to store/program data of one storage page (size) into a single storage page unit of memory device 202. That is, one storage page is stored. In the MLC storing mode, the memory controller 200 is arranged to execute the data storing operation for one time to store/program data of two storage pages into two storage page units (even page and odd page) of memory device 202. That is, two storage pages (even page and odd page) are stored. For example, the first storing mode mentioned above is the SLC storing mode, and the second storing mode mentioned above is the MLC storing mode. That is, the memory controller 200 may use the SLC storing mode to store one storage page data into a storage page of the memory device 202 or use the MLC storing mode to store two storage page data into two storage pages of the memory device 202. The minimum data amount which is actually stored into the memory device 202 is equal to one storage page when performing the storing operation for one time.

The data to be recorded each time may be larger or not larger than a size of one storage page unit in the memory device 202. In an example, the size of one storage page unit in the memory device 202 may be equal to 16K bytes (or 32K bytes), and the data to be recorded and stored each time may be equal to 4K bytes (but not limited). To save memory circuit costs, the buffer circuit 205 can be implemented using a smaller memory capacity (e.g. 4K bytes or 8K bytes, smaller than 16K bytes or 32K bytes), and the memory controller 200 is arranged to read back some portion data from memory device 202, use the 4K bytes with the read portion data to form and generate one storage page data, and store the one storage page data into a storage page unit of memory device 202. This will be described again.

In Step 110, the processing circuit 210 is arranged to determine whether the size of data unit transmitted from host device 201 is not larger than that of a particular storage unit or not. In this embodiment, the size of a particular storage unit means the size of a single storage page. For example, when the size of data unit is larger than that of one storage page, the processing circuit 210 is arranged to activate and use the MLC storing mode to store such data unit into two storage pages (even page and odd page) of the memory device 202 (Step 115B). In practice, the processing circuit 210 is arranged to activate a data complement process (a header data complement process and/or a tail data complement process) to read back portion data from the memory device 202 and use the portion data with the data unit to form/generate two page data (i.e. data (data amount) of two storage pages) and then use the MLC storing mode to store the two page data into two storage pages of the memory device 202.

Alternatively, when the size of data unit is equal to or smaller than that of one storage page, the processing circuit 210 is arranged to activate and use the SLC storing mode to store such data unit into a storage page of the memory device 202 (Step 115A). In practice, the processing circuit 210 is arranged to activate the data complement process (a header data complement process and/or a tail data complement process) to read back portion data from the memory device 202 and use the portion data with the data unit to form/generate one page data (i.e. data (data amount) of one storage page) and then use the SLC storing mode to store the one page data into one storage page of the memory device 202. The processing circuit 210 is able to dynamically use different storing modes to store data of different sizes into the memory device 202. Compared to the conventional mechanism, the performance of memory controller 200 is not degraded as well as the circuit costs can be saved significantly.

Figure 3:
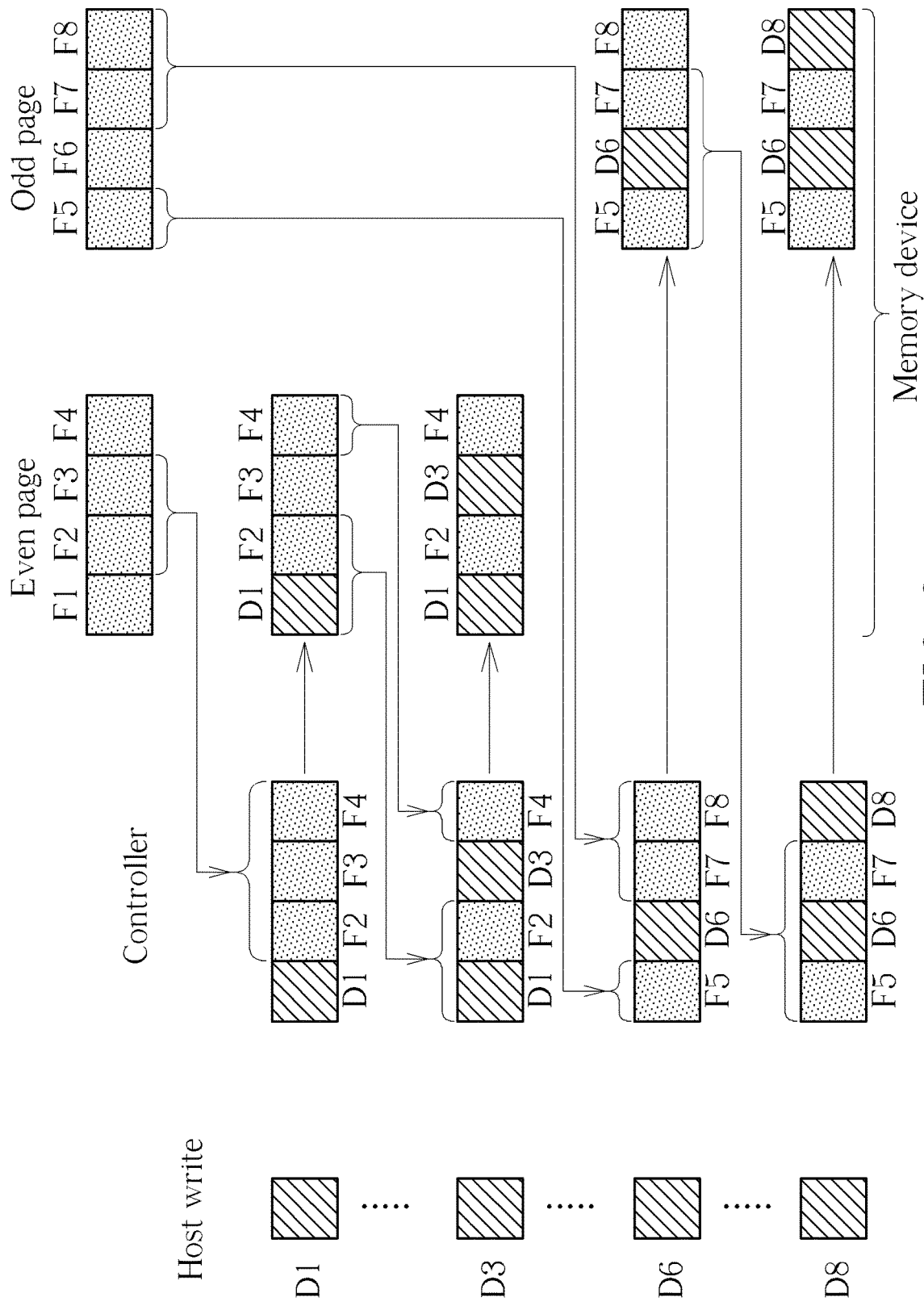
FIG. 3 is a diagram showing an example of memory controller as shown in FIG. 2 storing data into the memory device by dynamically using the SLC and MLC data storing modes.

FIG. 3 is a diagram showing an example of memory controller 200 as shown in FIG. 2 storing data into the memory device 202 by dynamically using the SLC and MLC storing modes. In this example, the memory device 202 defines even pages and odd pages. The host device 201 may sequentially write or record/update data units each having 4K bytes data amount to the storage device 203, and the size of one storage page unit in the memory device 202 is equal to 16K bytes. As shown in FIG. 3, the host device 201 may write a data unit having 4K bytes, e.g. D1, to the memory controller 200, and then the buffer circuit 205 receives and buffers such data unit D1. The processing circuit 210 is then used for activate the data complement process to read back portion data from the memory device 202 wherein the size of portion data is equal to that of three data units F2, F3, F4, each having 4K bytes, i.e. 12K bytes. For example, the data unit D1 may mean that the processing circuit 210 is arranged to store the data unit D1 into the location of the first 4K bytes of an even storage page in the memory device 202, and the processing circuit 210 is arranged to read back the second, third, and fourth 4K bytes, i.e. F2, F3, and F4 of such even storage page. The processing circuit 210 uses the data unit D1 with the 12K bytes (data F2, F3, F4) to form/generate one page data (16K bytes) and use the SLC storing mode to store the one page data into a storage page unit (the same page or different page) of the memory device 202. The processing circuit 210 does not read back data from an odd storage page corresponding to the even storage page. The processing circuit 210 processes only one page data amount without processing two page data amount.

In addition, the processing circuit 210 may be arranged to store data unit D3, which is to be stored into the location of the third 4K bytes of the even storage page. The processing circuit 210 is arranged to read back the first, second, and fourth 4K bytes, e.g. D1, F2, and F4 of such even storage page. The processing circuit 210 uses the data unit D3 with the 12K bytes (data D1, F2, F4) to form/generate one page data (16K bytes) and use the SLC storing mode to store the one page data into a storage page unit (the same page or different page) of the memory device 202. The processing circuit 210 does not read back data from an odd storage page corresponding to the even storage page. The processing circuit 210 processes only one page data amount without processing two page data amount.

In addition, the processing circuit 210 may be arranged to store data unit D6, which is to be stored into the location of the second 4K bytes of an odd storage page. The processing circuit 210 is arranged to read back the first, third, and fourth 4K bytes, e.g. F5, F7, and F8 of such odd storage page. The processing circuit 210 uses the data unit D6 with the 12K bytes (data F5, F7, F8) to form/generate one page data (16K bytes) and use the SLC storing mode to store the one page data into a storage page unit (the same page or different page) of the memory device 202. The processing circuit 210 does not read back data from an even storage page corresponding to the odd storage page. The processing circuit 210 processes only one page data amount without processing two page data amount.

In addition, the processing circuit 210 may be arranged to store data unit D8, which is to be stored into the location of the fourth 4K bytes of the odd storage page. The processing circuit 210 is arranged to read back the first, second, third 4K bytes, e.g. F5, D6, and F7 of such odd storage page. The processing circuit 210 uses the data unit D8 with the 12K bytes (data F5, D6, F7) to form/generate one page data (16K bytes) and use the SLC storing mode to store the one page data into a storage page unit (the same page or different page) of the memory device 202. The processing circuit 210 does not read back data from an even storage page corresponding to the odd storage page. The processing circuit 210 processes only one page data amount without processing two page data amount.

Figure 4:
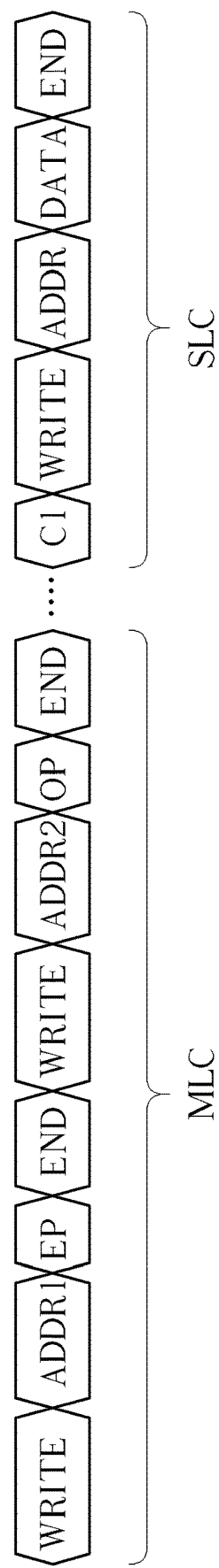
FIG. 4 is a diagram of an example of the communication between memory controller and memory device by dynamically using SLC data storing mode and MLC data storing mode to store data into the memory device.

FIG. 4 is a diagram of an example of the communication between memory controller 200 and memory device 202 by dynamically using SLC storing mode and MLC storing mode to store data into the memory device 202. As shown in FIG. 4, in a default setting (but not limited), the memory controller 200 is arranged to store data into the memory device 202 using MLC storing mode. In the MLC storing mode for storing even and odd storage pages, the processing circuit 210 issues or sends a write command WRITE, an even storage page address ADDR1, even storage page data EP such as 16K bytes data, and an end command END to the memory device 202 so as to store the even storage page data EP into an even storage page of memory device 202. The processing circuit 210 then issues or sends the write command WRITE, an odd storage page address ADDR2, odd storage page data OP such as 16K bytes data, and the end command END to the memory device 202 so as to store the odd storage page data OP into an odd storage page of memory device 202. For example, the write command WRITE may be 80h command and the end command END may be 10h command for a memory device produced or manufactured by the company of Micron Technology Inc. Additionally, the write command WRITE may be 80h command and the end command END may be 22h command for a memory device produced or manufactured by the company of SK Hynix Inc.

When determining that the data size of a buffered data unit is not larger than that of one storage page data, the memory controller 200 can switch to the SLC storing mode. In the SLC storing mode for storing a single storage page, the processing circuit 210 is arranged for further issuing or sending a particular command C1 which is followed by the above-mentioned write command WRITE before sending the write command WRITE. When the memory device 202 receives the particular command C1 and the write command WRITE, the memory device 202 can know that the memory controller 200 is arranged to store a single storage page. For example, the particular command C1 may be DAh command for the company of Micron Technology Inc., and may be BEh command for the company of SK Hynix Inc. In practice, in the SLC storing mode for storing an even or odd storage page, the processing circuit 210 issues or sends the particular command C1 (DAh command or BEh command), the write command WRITE (80h command), an even/odd storage page address ADDR, even/odd storage page data DATA such as 16K bytes data, and the end command END (10h command or 22h command) to the memory device 202 so as to store the even or odd storage page data DATA into an even or odd storage page of memory device 202.

Further, in other embodiments, the method of FIG. 1 can be applied into the memory device 202 supporting at least three different storing modes such as SLC, MLC, and TLC (triple-level-cell) storing modes. The first storing mode can be the SLC storing mode or MLC storing mode, and the second storing mode can be the TLC storing mode. In the default setting, the memory controller 200 can be arranged to use the TLC storing mode to write or store data units, transmitted from the host device 201, into the memory device 202. When determining that the size of a data unit is not larger than the size of two storage page data, the processing circuit 210 can switch from the TLC storing mode to the MLC storing mode and employ the MLC storing mode to store the data unit into the memory device. In addition, if determining that the size of such data unit is not larger than the size of one storage page data, the processing circuit 210 can switch from the TLC storing mode to the SLC storing mode and employ the SLC storing mode to store the data unit into the memory device.

Similarly, the method can be also applied into the memory device 202 supporting at least four different storing modes such as SLC, MLC, TLC, and QLC (quad-level-cell) storing modes. The operation is similar to the above-mentioned operation and the corresponding description is not detailed for brevity.

To summarize, the method and memory controller 200 are capable of switching between at least two different storing modes such as first and second storing modes and using the different storing modes to respectively store data units having different sizes into the memory device 202 wherein the first storing mode corresponds to M-level cell data storing and the second storing mode corresponds to N-level cell data storing. M and N are positive integers and M is smaller than N.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller coupled between a memory device and a host device, the memory device supporting at least two different storing modes, and the memory controller comprising:
   a buffer circuit, configured for receiving and buffering data transmitted from the host device; and
   a processing circuit, coupled to the buffer circuit, configured for:
      using a first storing mode to store a first data unit into the memory device, a size of the first data unit being not larger than a size of a specific storage unit defined in the memory device; and
      using a second storing mode, different from the first storing mode, to store a second data unit into the memory device, a size of the second data unit being larger than the size of the specific storage unit;
   wherein when the processing circuit is using the second storing mode, if the host device writes a data unit smaller than a storage page unit, then the processing circuit is arranged to read back one corresponding page data from the memory device to use the corresponding page data and the data unit smaller than the specific storage unit to generate a single storage page data and then write the single storage page data into a single storage page of the memory device to update the corresponding page data previously stored in the memory device.

2. The memory controller of claim 1, wherein the specific storage unit is equal to one storage page; the first storing mode is an SLC (single-level-cell) storing mode, and the second storing mode is an MLC (multi-level-cell) storing mode.

3. The memory controller of claim 2, wherein the processing circuit is arranged for determining whether the size of the data unit is larger than the size of the specific storage unit.

4. The memory controller of claim 2, wherein the processing circuit is arranged to send an SLC storing command to the memory device to use the SLC storing mode to store the first data unit into the memory device, and is arranged to send an MLC storing command to the memory device to use the MLC storing mode to store the second data unit into the memory device.

5. The memory controller of claim 1, wherein the specific storage unit is equal to two storage pages; the first storing mode is an MLC storing mode, and the second storing mode is an TLC (triple-level-cell) storing mode.

6. The memory controller of claim 1, wherein the first storing mode corresponds to M-level cell data storing, and the second storing mode corresponds to N-level cell data storing; M and N are positive integers and M is smaller than N.

7. A memory controller coupled between a memory device and a host device, the memory device having at least three different storing modes, and the memory controller comprising:
   a buffer circuit, configured for receiving and buffering a data unit transmitted from the host device and to be stored into the memory device; and
   a processing circuit, coupled to the buffer circuit, configured for using an MLC storing mode to store the data unit, transmitted from the host device, into the memory device for one time, a size of the data unit being not larger than a size of one storage page unit of the memory device;
   wherein when the processing circuit is using the MLC storing mode, if the host device writes the data unit smaller than the one storage page unit, then the processing circuit is arranged to read back one corresponding page data from the memory device to use the corresponding page data and the data unit smaller than the one storage unit to generate a single storage page data and then write the single storage page data into a single storage page of the memory device to update the corresponding page data previously stored in the memory device.

8. A method applied into a memory controller coupled between a memory device and a host device, the memory device supporting at least two different storing modes, and the method comprises:
   receiving and buffering data transmitted from the host device;
   using a first storing mode to store a first data unit into the memory device, a size of the first data unit being not larger than a size of a specific storage unit defined in the memory device;
   using a second storing mode, different from the first storing mode, to store a second data unit into the memory device, a size of the second data unit being larger than the size of the specific storage unit; and
   when the second storing mode is being used by the memory controller, reading back one corresponding page data from the memory device to use the one corresponding page data and a data unit smaller than the specific storage unit to generate a single storage page data and then write the single storage page data into a single storage page of the memory device to update the corresponding page data previously stored in the memory device if the host device writes the data unit.

9. The method of claim 8, wherein the specific storage unit is equal to one storage page; the first storing mode is an SLC (single-level-cell) storing mode, and the second storing mode is an MLC (multi-level-cell) storing mode.

10. The method of claim 9, further comprising:
    determining whether the size of the data unit is larger than the size of the specific storage unit.

11. The method of claim 8, wherein the specific storage unit is equal to two storage pages; the first storing mode is an MLC storing mode, and the second storing mode is an TLC (triple-level-cell) storing mode.

12. The method of claim 9, further comprising:
    sending an SLC storing command to the memory device to use the SLC storing mode to store the first data unit into the memory device; and
    sending an MLC storing command to the memory device to use the MLC storing mode to store the second data unit into the memory device.

13. The method of claim 8, wherein the first storing mode corresponds to M-level cell data storing, and the second storing mode corresponds to N-level cell data storing; M and N are positive integers and M is smaller than N.

* * * * *